United States Patent

Hutson

[15] 3,683,242

[45] Aug. 8, 1972

[54] SEMICONDUCTOR MAGNETIC DEVICE

[72] Inventor: Jearld L. Hutson, P.O. Box 34235, Dallas, Tex. 75234

[22] Filed: June 9, 1971

[21] Appl. No.: 151,314

[52] U.S. Cl........317/235 R, 317/235 H, 317/235 Y, 317/232 Z, 317/235 AM, 148/190

[51] Int. Cl...............................................H01l 11/06

[58] Field of Search.............317/235 WW, 235 YZ, 235 H, 235 AM, 317/235 AN

[56] References Cited

UNITED STATES PATENTS 3,533,159 10/1970 Hudson .....................317/235

3,614,555 10/1971 Glinski et al...............317/235

*Primary Examiner*—Jerry D. Craig

*Attorney*—Thomas A. Harwood and Kenneth R. Glaser

[57] ABSTRACT

A silicon semiconductor device having an N-type electrical conductivity emitter, a P-type electrical conductivity base, and a pair of spaced apart N-type electrical conductivity collectors equally spaced from the emitter, and which produces an electrical signal responsive to a magnetic field applied thereto. Regions of the base adjacent to the emitter and collector junctions are doped with gallium to control the collector efficiency of the transistor.

5 Claims, 3 Drawing Figures

*INVENTOR*
JEARLD L. HUTSON

Thomas A. Harwood

*ATTORNEY*

SEMICONDUCTOR MAGNETIC DEVICE

This invention relates to a semiconductor device, and more particularly to a transistor that produces an electrical signal responsive to a magnetic field applied thereto.

There are several different semiconductor magnetic transducers that have been devised for various applications that have advantages over the well known Hall effect type devices. One is a transistor device having an emitter, base and a pair of spaced apart collectors, in which the current flow between the emitter and the two collectors through the base is affected by a magnetic field having a component thereof applied perpendicular to the plane in which current flows. Such a device usually has the two collectors spaced equally from the emitter, so that equal currents flow in the collectors from the emitter in the absence of a magnetic field. When a magnetic field is applied to the device perpendicular to the current flow between the emitter and collectors, the relative amounts of current flowing to the collectors is changed depending upon the direction or sense of the magnetic field and the magnitude thereof. Thus an electrical signal is produced by the device responsive to the presence of the magnetic field; whether or not the magnetic field is varying or steady.

It is usually desirable in such device that the base region be very lightly doped, or have a very high electrical resistivity, even to the extent that this region is intrinsic. If the base region is intrinsic, or of a very high electrical resistivity, the electric carries may be considered as free charges in a vacuum space, since no emitted carriers will be recombined in this region. Therefore, the magnetic field will have a maximum effect on the charge carriers traversing the base region under these conditions. However, as the resistivity of the base region is increased to the point that the base region becomes intrinsic or if the base region is sufficiently narrowed, the collector efficiency is normally increased accordingly until the transistor is always "on" or conducting current between the collector and emitter for any voltage applied thereacross. In other words, the device acts like a transistor conducting in saturation. In this case, the collector and emitter depletion regions effectively contact each other. This is undesirable because a loss of control over the electrical signal output results.

The present invention provides a semiconductor device that produces an electrical signal output responsive to a magnetic field applied thereto with maximum sensitivity. This is accomplished with a transistor device having an emitter, a base and a pair of collectors, in which the electrical resistivity of the base region is very high and approaches the intrinsic level. Uncontrolled conduction of the device is prevented by raising the electrical conductivity of the base region immediately adjacent the emitter and collector junctions. More particularly, the magnetically responsive device comprises an NPN transistor having a high resistivity base region of P-type electrical conductivity, an N-type electrical conductivity emitter region and a pair of spaced apart N-type electrical conductivity collector regions. The two collector regions are equally spaced from the emitter region, so that equal currents flow to the collector regions from the emitter region in the absence of a magnetic field applied to the device. The base is doped with an impurity concentration of about $10^{13}$ acceptor atoms per cubic centimeter in a silicon body, so that the electrical resistivity of the base region is about 10,000 ohm-centimeter. Regions of the base region adjacent the emitter and two collectors are doped more heavily with gallium. This prevents the uncontrolled conduction between the emitter and collectors when a voltage is applied thereacross. The reasons for the effects of the gallium on the conduction of the transistor are not clear, although it is thought that the increased electrical conductivity of the base region immediately adjacent the emitter and collector junctions controls the widths of the depletion regions to prevent the device from acting as a PIN diode. Thus to some extent, the collector efficiency of the device and the alpha gain (the latter which defines the fraction of electron current injected at the emitter and which reaches the collector) of the transistor are controlled. Gallium is used as the impurity for increasing the electrical conductivity immediately adjacent the emitter and collector junctions since a minimum stressing of the crystal lattice occurs in the use of this impurity.

Many other objects, features and advantages of the present invention will become readily apparent from the following detailed description thereof when taken in conjunction with the appended claims and the attached drawing wherein like reference numerals refer to like parts throughout the several figures, and in which:

Figure 1:
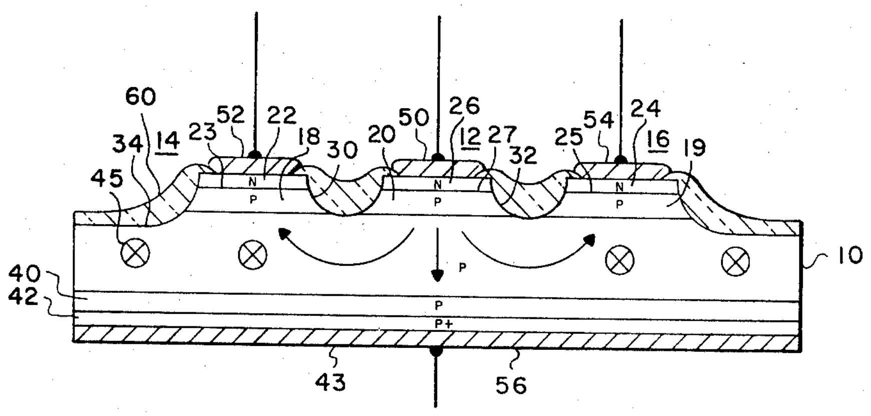
FIG. 1 is a side elevational view, in section, of a preferred embodiment of the magnetically responsive device of the invention.
Figure 3:
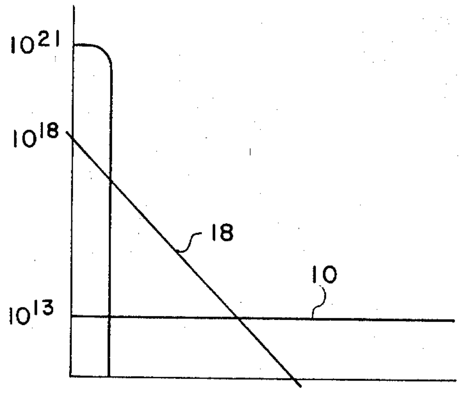
FIG. 3 is a graphical representation of the impurity concentrations in various regions of the device.

A preferred embodiment of the semiconductor device of the invention is shown in FIG. 1 and comprises a body 10 of P-type electrical conductivity silicon, a portion of which acts as the base of a transistor. The silicon body is doped to a concentration level of about $10^{13}$ acceptor impurity atoms per cubic centimeter, so that the resistivity is about 10,000 ohm-centimeter. The device includes an emitter 12, and two spaced apart collectors 14 and 16, all adjacent to base region 10. It will be seen that the device is of mesa construction, although a planar construction can also be used. Gallium as an impurity is diffused into both the top and bottom surfaces of the semiconductor body to form regions of greater electrical conductivity than the base region 10, prior to etching the upper surface of the device to form the individual mesas. As is seen in the graphical representation of FIG. 3, the base or starting semiconductor body 10 has an impurity concentration of about $10^{13}$ acceptor atoms per cubic centimeter throughout. Gallium is diffused at a concentration of about $10^{18}$ atoms per cubic centimeter at the surface of the body. After the gallium diffusion, phosphorous is diffused into the top surface of the semiconductor body to establish an N-type electrical conductivity region from which the emitter and two collectors are formed. The phosphorous is diffused from a surface concentration of about $10^{21}$ atoms per cubic centimeter. Thus the base 10 is provided with shadow diffusions in each surface thereof to increase the electrical conductivity, and an N-type electrical conductivity region is formed in the shadow region at one surface and forms a rectifying junction therewith. The bottom surface of the body is thereafter diffused with boron to produce a very high electrical conductivity region 42 (shown as the P+ region) so that an electrode can be ohmically attached thereto.

Figure 2:
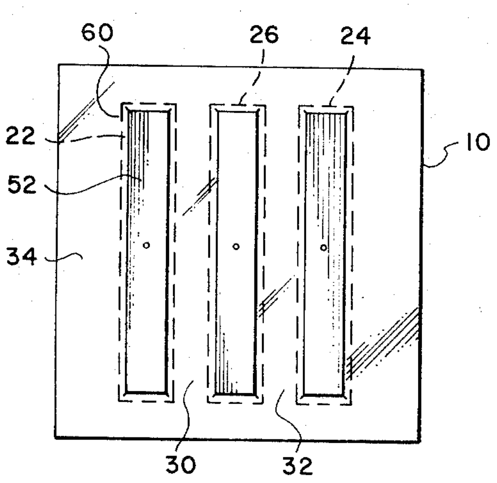
FIG. 2 is a schematic plan view of the device shown in FIG. 1.

After the body is diffused, the top surface is etched to isolate a mesa 12 having an N-type electrical conductivity emitter 26, and mesas 14 and 16 on opposite sides thereof having N-type electrical conductivity collectors 22 and 24, respectively, all as shown in the top view of FIG. 2. The body is etched to a depth sufficient to penetrate through the region created by the diffusion of gallium atoms, so that a P-type electrical conductivity region 20 immediately adjacent emitter 26 is isolated, and separate P-type electrical conductivity regions 18 and 19 immediately adjacent collectors 22 and 24, respectively, are isolated. It will be seen that there is a rectifying junction 27 formed between emitter 26 and region 20, and rectifying junctions 23 and 25 formed between collectors 22 and 24 on the one hand and regions 18 and 19 on the other hand, respectively. Thus an etched groove 30 extends between emitter 26 and collector 22, and an etched groove 32 extends between emitter 26 and collector 24. Another etched groove 34 extends around these regions at the periphery of the device and intersects these grooves at the ends thereof.

After the device has been etched, a layer 60 of glass is applied to the top surface of the device to cover the junctions where they are exposed in the grooves, so as to passivate the junctions. Such glass passivation techniques are well known. Thereafter, an electrode 50 is ohmically attached to the emitter region 26, and electrodes 52 and 54 are ohmically attached to the two collector regions 22 and 24, respectively. A base electrode 56 is ohmically attached to P+ region 42 at the bottom surface of the body.

It is desirable, of course, to achieve as great a sensitivity as possible, so that a magnetic field applied to the device will have a maximum effect on current flow between the emitter and the two collectors. To this end, the resistivity of the base 10 is made high enough to be very nearly intrinsic, so that the magnetic field has a maximum effect on charge carriers to deflect them. That is to say, the very nearly intrinsic base region approximates a vacuum through which the charge carriers move, whereby little, if any interference to the carrier movement occurs from impurities in the crystal lattice. The magnetic field 45, shown by the arrow tail, or a component thereof is into the plane of the drawing, or perpendicular to current flow. It will be seen, then, that grooves 30 and 32 must completely penetrate regions 18 and 19, so that the charge carriers must drift through the high resistivity base region from emitter to collector.

With the resistivity of the base high enough to approximate the intrinsic level, the device tends to act as a PIN diode, in which saturation conduction takes place between emitter and collectors for any substantial emitter to collector voltage. Of course, loss of control and sensitivity results upon this occurrence. The shadow diffused regions 18, 19 and 20 prevent this from happening by preventing uncontrolled conduction between the emitter and the two collectors. It is speculated that the gallium doping prevents the device from acting as a PIN diode since an increased electrical conductivity adjacent these two junctions tends to decrease the depletion widths surrounding the junctions. Further, it is believed that the gallium doping has an effect on the collector efficiency and on the alpha gain of the transistor.

As is seen from the drawing, the gallium diffusion must extend beneath the emitter and collector junctions, or into the base region by at least a small distance. It has been found that that the gallium must be diffused from a surface concentration of at least $10^{17}$ atoms per cubic centimeter and to a distance sufficient to penetrate below the emitter and collector junctions in order to have the above described affects.

Although the invention has been described with reference to a particular embodiment thereof, it will be appreciated by those skilled in the art that certain modifications and substitutions can be made without departing from the true scope of the invention. Accordingly, it is intended that the invention be limited only as defined in the appended claims.

What is claimed is:

1. A magnetically responsive silicon transistor device comprising:

a. an N-type electrical conductivity emitter, b. first and second spaced apart N-type electrical conductivity collectors, each spaced from said emitter, and c. a P-type electrical conductivity base intermediate said emitter and said first and said second collectors, d. said base having first and second regions adjacent said first and said second collectors, respectively, that contain gallium as an impurity to impart an electrical conductivity thereto higher than the remainder of said base, e. whereby a magnetic field having a component thereof applied to said device perpendicular the current flow through said base affects the relative amounts of current flowing in said first and said second collectors.

2. A magnetically responsive silicon transistor device as set forth in claim 1 whereby said base has an impurity concentration of about $10^{13}$ acceptor impurities per cubic centimeter.

3. A magnetically responsive silicon transistor device as set forth in claim 1 whereby said first and said second collectors are equally spaced from said emitter.

4. A magnetically responsive silicon transistor device as set forth in claim 1 whereby said device comprises a body of silicon into which impurities are diffused to form said emitter, said base and said first and said second collectors; and in which said gallium is diffused into said base from a concentration at the surface of said body of at least $10^{17}$ gallium atoms per cubic centimeter.

5. A magnetically responsive silicon transistor device as set forth in claim 1 whereby said device comprises a body of silicon into which impurities are diffused to form said emitter, said base and said first and said second collectors; wherein said body has a concentration of about $10^{13}$ atoms per cubic centimeter with an impurity that determines P-type electrical conductivity to establish said base; said body being diffused with gallium from a surface concentration of at least $10^{17}$ gallium atoms per cubic centimeter to form said first and said second regions, and being diffused from a surface concentration much greater than $10^{17}$ atoms per cubic centimeter with an impurity that determines N-type electrical conductivity to form said emitter and said first and said second collectors.

* * * * *